(12) United States Patent
Visokay et al.

(10) Patent No.: US 7,105,891 B2
(45) Date of Patent: Sep. 12, 2006

(54) GATE STRUCTURE AND METHOD

(75) Inventors: Mark R. Visokay, Richardson, TX (US); Antonio L. P. Rotondaro, Dallas, TX (US); Luigi Colombo, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/195,271

(22) Filed: Jul. 15, 2002

(65) Prior Publication Data

US 2004/0007747 A1    Jan. 15, 2004

(51) Int. Cl.
H01L 29/94 (2006.01)

(52) U.S. Cl. ............... 257/338; 257/391; 257/E27.062

(58) Field of Classification Search ................. 257/69, 257/338, 357, 391, E27.062, E27.108
See application file for complete search history.

(56) References Cited

U.S. PATENT DOCUMENTS 4,931,411 A * 6/1990 Tigelaar et al. ............ 438/201
5,097,311 A * 3/1992 Iwase et al. ................ 257/369
6,051,460 A * 4/2000 Nayak et al. ............... 438/232
6,130,123 A * 10/2000 Liang et al. ................ 438/217
6,258,643 B1 * 7/2001 Hsu ........................... 438/199
6,372,566 B1 * 4/2002 Kittl et al. .................. 438/206
6,376,888 B1    4/2002 Tsunanashima et al. .... 257/407
6,383,879 B1    5/2002 Kizilyalli et al. ........... 438/303
6,458,641 B1 * 10/2002 Tsukamoto ................. 438/197
2003/0096471 A1 * 5/2003 Lee et al. .................... 438/232

OTHER PUBLICATIONS

S. Paasch and Schwaller, "Thermodynamic Properties of Pd-X-Alloys, with X—Gd, Y, Ce;" Derichte der Bunsen—Gesellschaft, vol. 87 (9), p. 812-14 (1963).
CRC Handbook of Chemistry and Physics, p. 12-130, 82$^{nd}$ Edition, CRC press (2001-2002.

* cited by examiner

Primary Examiner—Allan R. Wilson
(74) Attorney, Agent, or Firm—Carlton H. Hoel; W. James Brady, III; Frederick J. Telecky, Jr.

(57) ABSTRACT

CMOS gate structure with metal gates having differing work functions by texture differences between NMOS and PMOS gates.

3 Claims, 4 Drawing Sheets

GATE STRUCTURE AND METHOD

CROSS-REFERENCE TO RELATED APPLICATIONS

The following patent applications disclose related subject matter: Ser. No. 10/135,725, filed Apr. 29, 2002 and 10/302,212, filed Nov. 22, 2002. These applications have a common assignee with the present application.

BACKGROUND OF THE INVENTION

The present invention relates to semiconductor transistor fabrication and more particularly to complementary field effect transistors (CMOS) and integrated circuits containing them.

Integrated circuit technology continues to advance at a rapid pace, with many circuit technologies being implemented using semiconductor fabrication processes. With the advancement of semiconductor circuit fabrication methods, consideration is given to various aspects, including maximizing efficiency, lowering manufacturing cost, and increasing performance. With these goals in mind, one area is the continuing trend of reducing the thickness of the transistor gate dielectrics. For example, in the past the gate dielectric (e.g., silicon dioxide or nitrided silicon dioxide) layer thickness was on the order of 10 nm, but more recently that thickness has reduced considerably with a more current goal being on the order of 2 nm Indeed, this goal will strive for even thinner gate dielectric layers in the foreseeable future. This goal reduces device size and facilitates improved device performance.

While the desirability and trend toward thinner gate dielectrics continues, such an approach also provides a considerable drawback. Specifically, overlying the thin gate dielectric is a polycrystalline silicon ("polysilicon") gate layer, and polysilicon naturally includes a depletion region at the interface between the polysilicon gate and the gate dielectric. Typically, the depletion region manifests itself as providing the electrical equivalent of approximately a 0.3 nm thick insulator and, as such, the region in effect provides an insulating effect rather than a conducting effect as would be present in the remainder of the polysilicon gate conductor. Using the preceding numeric example, therefore, for a 10-nm thick gate dielectric, then the overlying effective 0.3-nm thick polysilicon depletion region may be thought to effectively increase the overall insulation between the gate and the underlying transistor channel from 10 nm to 10.3 nm, that is, the effect of the depletion region affects the insulating thickness by three percent—as such, for previous thicker gate insulators the effect of the polysilicon depletion region may be considered to have a negligible impact on the gate dielectric. In contrast, however, for a 2-nm thick gate dielectric, the polysilicon gate conductor depletion region may be thought to increase the gate insulator to 2.3 nm, thereby representing an increase on the order of 15 percent. This increased percentage significantly reduces the benefits otherwise provided by the thinner gate dielectric.

One approach in general to avoiding the depletion region phenomenon of polysilicon transistor gates is to use metal as an alternative material for the transistor gate because metal does not present a considerable depletion region, if any. Prior to the more recent use of polysilicon gates, metal gates were fairly common. However, a previously-identified drawback of such metal gates, which indeed led to the avoidance of such metals in contemporary devices, is that each metal has a corresponding so-called work function, and in the transistor art each transistor also has a corresponding preferred value for a work function of the gate electrode. However, the desired work function value differs for different transistor types. For example, based on present day threshold voltage channel doping, a p-channel MOS transistor ("PMOS") is optimized when the gate electrode has a work function on the order of 5 eV; while an n-channel MOS transistor ("NMOS") is optimized when the gate electrode has a work function on the order of 4 eV. The problem with previously-used metal gates arose with the development of CMOS circuits which, by definition, include both PMOS and NMOS transistors. Specifically, because a metal gate provides only a single work function, then it could not be selected to provide the two different desired work functions of the PMOS and NMOS devices. Instead, at best a metal could be selected to be between the desired work function of a PMOS and an NMOS transistor, which is sometimes referred to as the "midgap" between these devices (i.e., on the order of 4.5 eV for the preceding examples). This inability to match different work functions led to the use of polysilicon gates whereby the polysilicon gates of the NMOS devices could be doped in a first manner in view of the desired work function for NMOS transistors and the polysilicon gates of the PMOS devices could be doped in a second manner in view of the desired work function for PMOS transistors.

More recent approaches have used two different metals for gates. For example, U.S. Pat. No. 6,265,258 deposits a tantalum metal gate layer (work function about 4.2 eV) and then selectively nitrides the portion over the PMOS areas to form tantalum nitride gates (work function about 5.4 eV) while the NMOS gates remain tantalum. Similarly, U.S. Pat. No. 6,204,103 deposits polysilicon and over the NMOS areas deposits titanium and over the PMOS areas deposits molybdenum; then an anneal simultaneously forms titanium silicide gates for NMOS and molybdenum silicide gates for PMOS. And Polishchuk et al, Dual Work Function Metal Gate CMOS Technology Using Metal Interdiffusion, 22 IEEE Elect. Dev. Lett. 444–446 (2001) describes forming two CMOS gates of two differing metals: Ti and a Ti:Ni mixture with the Ni segregating at the gate dielectric interface by diffusion of the Ni through the Ti. This provides gate work functions of about 3.9 (Ti) for the NMOS and about 5.3 (Ni) for the PMOS.

However, the foregoing two metal or silicide gate approaches have processing drawbacks including silicide interface discontinuities.

SUMMARY OF THE INVENTION

The present invention provides integrated circuit fabrication including NMOS and PMOS devices having metal gates with differing work functions arising from texture of the metal.

This has the advantages of simple fabrication of metal gate CMOS with differing gate work functions.

BRIEF DESCRIPTION OF THE DRAWINGS

The drawings are heuristic for clarity.

DESCRIPTION OF THE PREFERRED EMBODIMENTS

1. Overview

Preferred embodiment integrated circuits fabrication methods include fabrication of metal gates with differing work functions for NMOS and PMOS devices by controlling the texture of the gate material. Preferred embodiment circuits include metal gates of two different textures on the same integrated circuit.

2. First preferred embodiment methods

FIGS. 1a–1h illustrate in cross sectional elevation views the steps of first preferred embodiment fabrication methods for integrated circuits including field effect transistors (e.g., CMOS or BiCMOS) with metal gates. The preferred embodiments include the following steps:

(1) Substrate

Figure 1A:
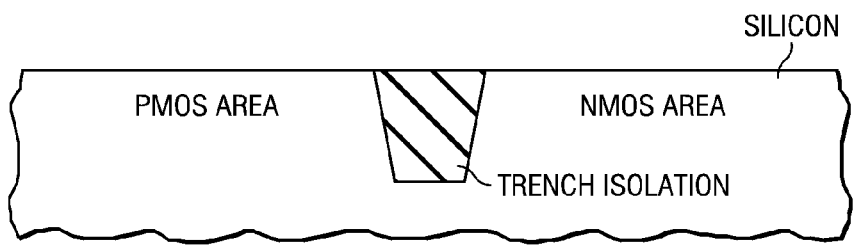
FIGS. 1a–1h are cross sectional elevation views of steps of a preferred embodiment integrated circuit fabrication method.
Figure 1B:
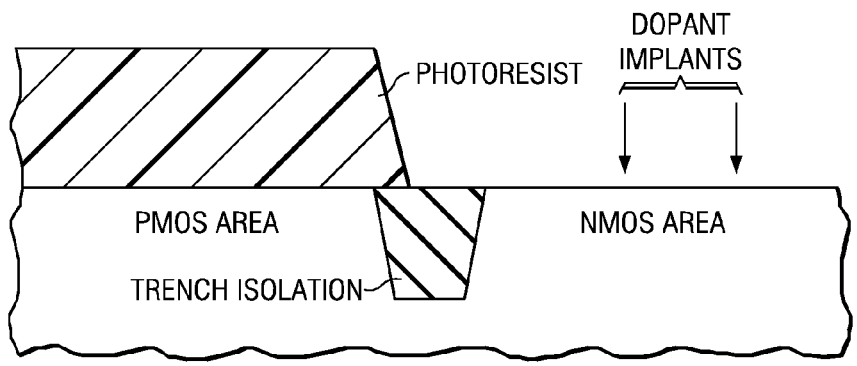

Start with a p-type silicon (or silicon-on-insulator) wafer 102 with <100>orientation and form shallow trench isolation by pad oxide growth, nitride deposition, trench pattern, nitride-oxide-silicon trench etch, trench surface oxidation, trench fill by blanket APCVD oxide deposition, etch-CMP planarization, and nitride strip. FIG. 1 a is a cross-sectional elevation view of the substrate illustrating the trench isolation and locations for fabrication of NMOS and PMOS transistors. Next, perform multiple dopant implants to form n- and p-type wells (plus, optionally, memory cell array wells and bipolar device buried layers) plus form channel stop regions, punchthrough deterrence regions, and threshold adjust regions. These implants are performed through the residual pad oxide. FIG. 1b illustrating the masked NMOS transistor location implants; a similar masked implant occurs in the PMOS locations. Note that the implant doses and depths may differ for memory cell array transistors as compared to peripheral transistors. Also, both high and low voltage transistors of the same type may be formed and may have different implant doses and depths. A rapid thermal anneal (e.g., 1050° C. for 30 s) activates and diffuses the implanted dopants (e.g., boron and phosphorus).

(2) Gate dielectric formation

The preferred embodiment gates may be formed on either conventional gate dielectrics (e.g., thermally grown silicon dioxide, silicon oxynitride, silicon nitride, etc.) or high-k gate dielectrics (e.g., deposited $HfSiO_r$, $Ta_2O_5$, etc.). For illustration, the following deposits a high-k gate dielectric layer.

Figure 1C:
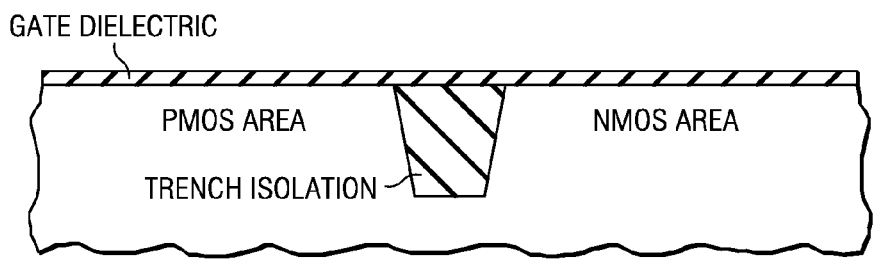

Deposit high-k gate dielectric, i.e. $Hf_{0.55}Si_{0.45}O_2$, by CVD, ALD or PVD to a thickness of about 7 nm; see FIG. 1c. Other non-stoichiometric variations of the hafnium silicate could be used; that is, $Hf_wSi_xO_y$. This deposition of silicate results in an effective dielectric constant of about 14, so the 7 nm thick silicate has an equivalent silicon dioxide thickness of 2 nm but not the leakage (tunneling) current of such a thin silicon dioxide gate dielectric. Also, after deposition the hafnium silicate dielectric layer could be nitrided and compensate for oxygen vacancies. That is, the resultant dielectric material may generally be $Hf_wSi_xO_yN_z$ with the composition roughly stoichiometric but not easily crystallizable.

Figure 1D:
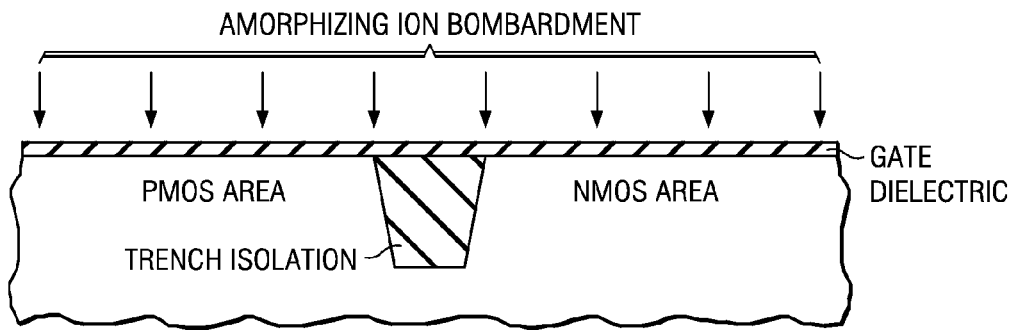

Optionally, the amorphous character of the high-k gate dielectric layer may be ensured by a low energy ion implantation as illustrated in FIG. 1d. The ions may come from a plasma with bias on the order of 500 volts relative to the high-k gate dielectric.

(2') Split gate dielectric option

Various integrated circuits include both high voltage and low voltage transistors; that is, MOS transistors with differing operating voltages such as differing maximum source-drain voltages and gate-source voltages. For example, a high voltage transistor could be used for peripheral transistors or programmable transistors, and low voltage transistors used for central processor or memory array transistors to limit power consumption and heat generation. High voltage MOS transistors require a thicker gate dielectric than low voltage MOS transistors in order to avoid breakdown. A modification of the foregoing step (2) can provide for two or more transistor gate dielectric thicknesses through various approaches. For example, first grow a thin silicon dioxide layer; next, strip this oxide layer in areas for low voltage transistors; then perform passivation and silicate deposition of step (2) with silicate dielectric thickness targeted for the low voltage transistors. The unremoved initial grown oxide under the silicate dielectric in the areas for high voltage transistors provides the required extra dielectric thickness.

(3) Gate metal deposition

Figure 1E:
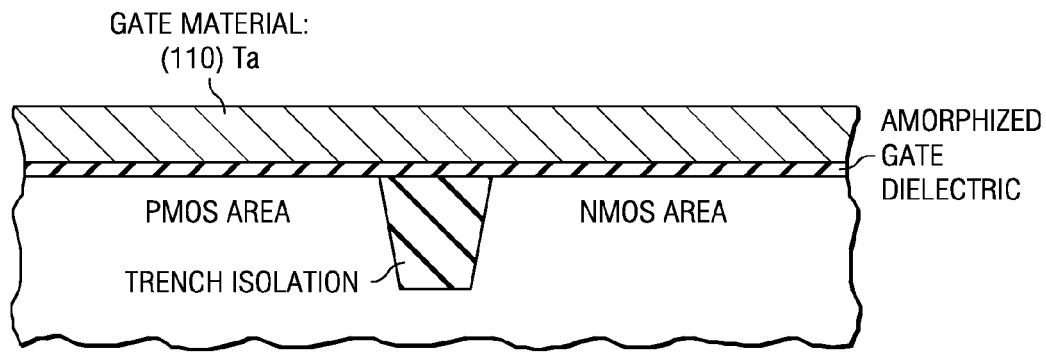
Figure 1F:
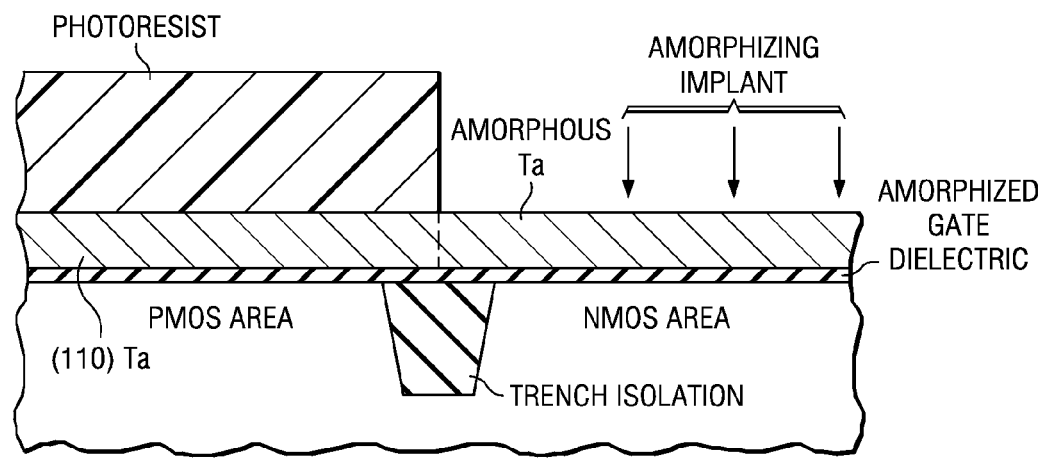

Sputter deposit 100 nm of tantalum onto the gate dielectric layer-coated substrate under conditions (e.g., 450° C.) to grow (110)-oriented α-phase (bcc) Ta; see FIG. 1e. The deposition could be by CVD, ALD, sputtering, evaporation, etc. The main requirement is crystallographic orientation. The Ta layer may be either thin (e.g., 30–50 nm) with a subsequent cladding layer or thick (e.g., 100+nm).

(4) Gate metal texture modification

The textured metal preferred embodiments use two versions of the same material to provide the two work functions. Indeed, (110)-oriented a-phase Ta has a work function of 4.8 eV which is close to the optimal PMOS gate work function, whereas (111)-oriented ac-phase Ta has a work function of 4.0 eV which is close to the optimal for an NMOS gate. Similarly, the amorphous or polycrystalline form typically has a different work function, and the NMOS gate could be amorphous Ta with a work function of 4.25 eV and used in place of the (111)-oriented ac-phase Ta. In particular, the preferred embodiment proceeds by spin-on, expose, and develop a non-critical photoresist mask on the Ta gate metal layer in the PMOS areas. Then implant Ta (or an inert species such as He) into the Ta layer in the unmasked NMOS areas with ion energy depending upon layer thickness (e.g., 1 MeV) and a dose of $10^{14}$ ions/cm$^2$; see FIG. 1f. This implant amorphizes the Ta and thereby lowers the work function to 4.25 eV for the eventual NMOS gates. Alternatively, the amorphous Ta could then be recrystallized to (111)-oriented Ta without affecting the orientation of the existing (110)-oriented Ta over the PMOS areas. When the gate metal layer is too thin for low resistance gates, strip the photoresist and sputter deposit a cladding layer of, for instance, W or Ta; see FIG. 2 and section 3 below.

Molybdenum provides an alternative gate metal with differing textures having NMOS and PMOS type work functions. In particular, (110) Mo has a work function of about 4.95 eV, whereas polycrystalline/amorphous Mo has a work function of about 4.3 eV. Similarly, niobium provides differing work functions: (110) Nb has a work function of about 4.87 eV and polycrystalline/amorphous Nb has a work function of about 4.0 eV.

(5) Gate mask and etch.

Spin on a layer of photoresist which is sensitive to deep ultraviolet; optionally, an antireflective coating (ARC) layer could be deposited prior to the photoresist in order to limit interference effects during photoresist exposure. The composition of the ARC and thickness are selected according to the exposure wavelength and the reflectivity of the underlying material. Expose the photoresist through a reticle for gates and gate level interconnects; the exposed minimal linewidth may be about 50 nm. Lastly, develop the photoresist and strip exposed ARC, if any.

Figure 1G:
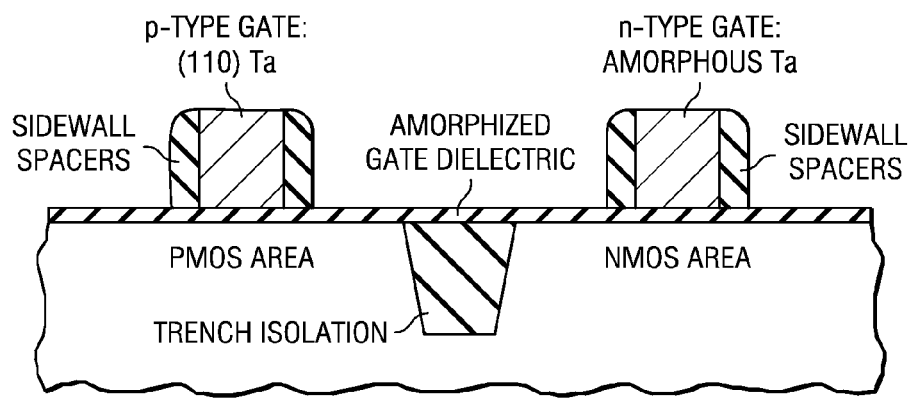

Use the patterned photoresist as an etch mask for the anisotropic RIE or high-density plasma etch of the gate material (amorphous and (110) Ta) to form gates and gate level interconnects. The etch may be a two (or more) step process with an initial fast etch (such as a fluorine-based etchant source) followed by a chlorine-based etchant source which is selective to silicon dioxide and high-k dielectric material. If the gate etch erodes the photoresist, the underlying ARC layer provides sufficient etch masking. Gates are 100 nm high and 50 nm long (FIG. 1g is a cross section along the gate length, and gates typically have widths much greater than their lengths).

Next, form sidewall spacers on the gates (and gate level interconnects) by a blanket conformal deposition of spacer material (such as 20 nm of silicon nitride or silicon dioxide) followed by anisotropic etch back to remove the spacer material from horizontal surfaces. FIG. 1g illustrates the resulting sidewall spacers.

Implant dopants to form source/drain regions using the gates plus sidewall spacers as self-aligning masks. As before, use a non-critical mask on the NMOS regions during PMOS source/drains implant and a non-critical mask on the PMOS regions during NMOS source/drains implant. The implants can be through any exposed high-k gate dielectric material over the source/drain regions, or the exposed high-k gate dielectric material can first be etched off. For lightly-doped drains, use first implants after gate formation but prior to sidewall spacer formation.

(6) Interlevel dielectric and contacts

Figure 1H:
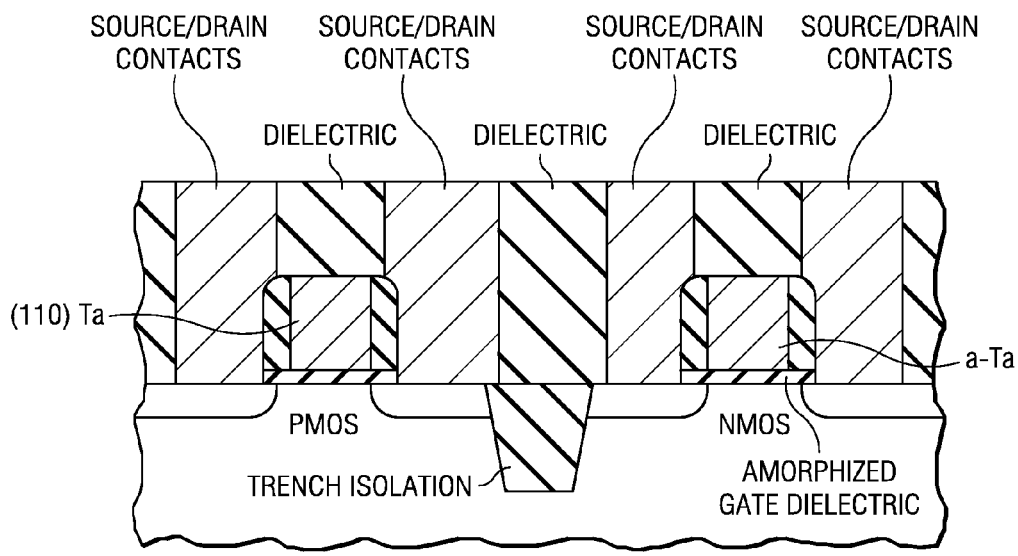

FIG. 1h illustrates subsequent structure after deposition of a first interlevel dielectric and formation of contacts to source/drains. The integrated circuit fabrication continues with further levels of dielectrics and interconnects.

3. Clad gates

Figure 2:
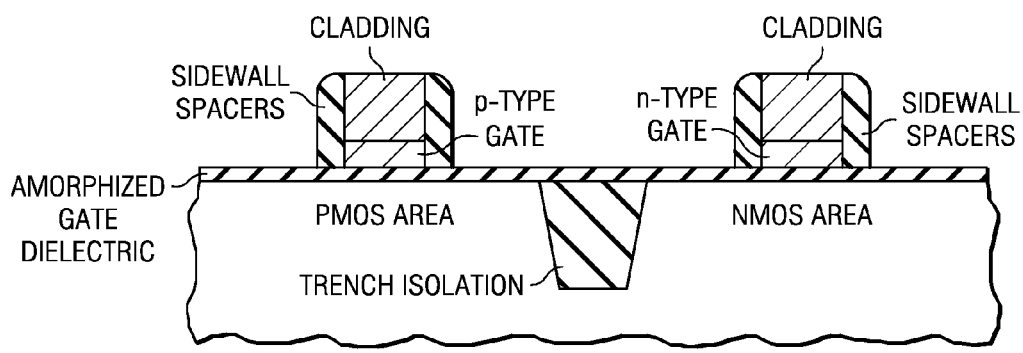
FIG. 2 shows in cross sectional elevation view a second preferred embodiment.

Further, the gates could be clad with a metal or metal silicide to increase conductivity; see FIG. 2. This cladding permits thin metal for the texture control, and a thick, possibly different, cladding metal for high conductivity.

4. Disposable gate preferred embodiments

Figure 3A:
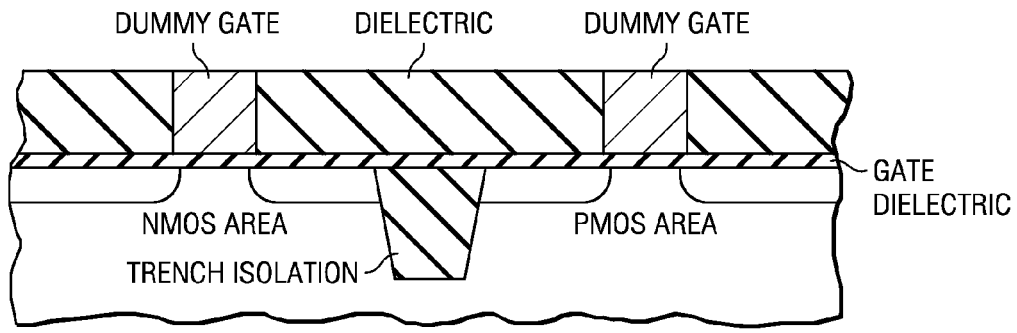
FIGS. 3a–3c illustrate a dummy gate preferred embodiment.
Figure 3B:
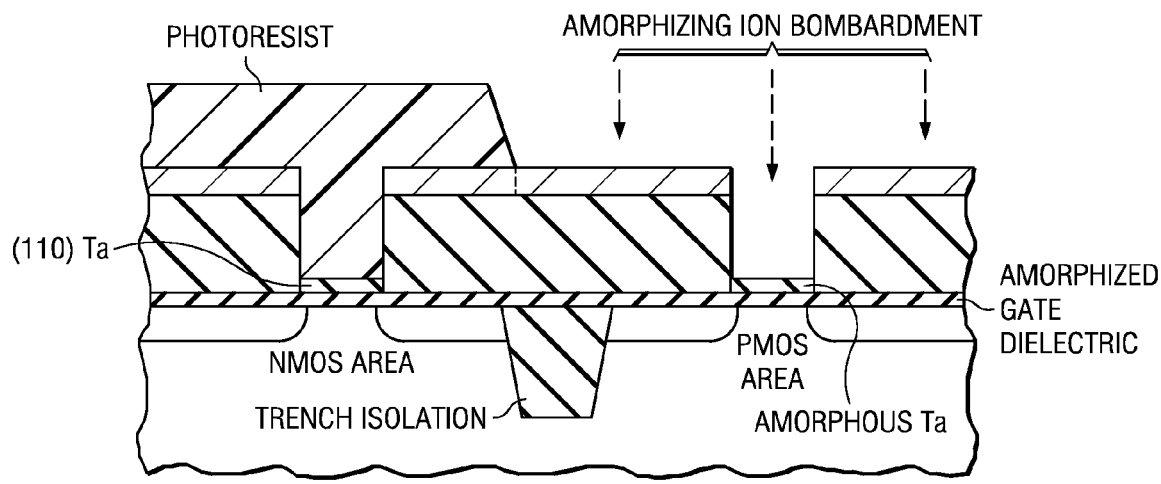
Figure 3C:
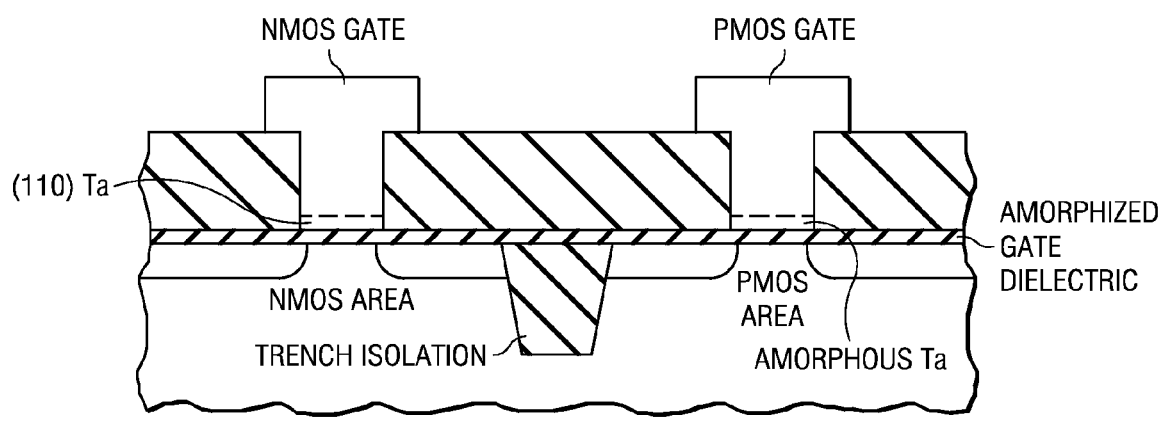

FIGS. 3a–3c illustrate a preferred embodiment disposable (dummy) gate method of integrated circuit fabrication which uses a high-k gate dielectric amorphization. In particular, follow the steps (1)–(5) of the foregoing preferred embodiment but with polysilicon gate material to have a polysilicon dummy gate (with sidewall spacers) and source/drains formed in the substrate. In the case of high-k gate dielectric material, the gate dielectric layer may have been amorphized as in step (2) or the amorphization may be deferred until after removal of the dummy gates or may be performed at both times. Or the gate dielectric may also be a dummy and removed along with the dummy gates with another gate dielectric then formed.

Deposit 200-nm-thick interlevel dielectric (premetal dielectric), such as TEOS oxide, and planarize the resulting structure, such as by CMP, to expose the top of the polysilicon dummy gate. FIG. 3a shows dummy gates which may be about 200 nm high and 50 nm long.

Etch out the dummy gates with an $HBr+O_2$ plasma which stops on the gate dielectric layer. Optionally, also strip the (dummy) gate dielectric and form a new gate dielectric, such as thermally-grow oxide or deposit a new 7 nm thick high-k gate dielectric layer, at the bottom of the groove left by the removal of dummy gates; this may also deposit roughly 7 nm of high-k on the sidewalls to shorten the eventual gate to 35–40 nm. Of course, if the original gate dielectric layer is removed at the bottoms of the grooves, then the original gate dielectric layer could be any convenient dielectric material, such as silicon dioxide. Then in case of a high-k gate dielectric material perform an amorphizing ion bombardment of the gate dielectric layer; this may be omitted if the treatment had previously been performed on the high-k gate dielectric layer prior to dummy gate material deposition.

Next, blanket deposit a gate material, such as one of the foregoing metals (e.g., (110)-oriented Ta), alloys, silicides, etc. to fill the bottoms of the grooves plus cover the planarized dielectric; the gate material may be thin (e.g., 30–50 nm) for easy texture modification or thick (e.g., 50+nm). To form different work function gates for NMOS and PMOS, pattern photoresist and implant to change the texture of the metal at the bottom of the grooves in the NMOS (PMOS) areas. Lastly, deposit more conductive material to fill the grooves plus surrounding interlevel dielectric. See FIG. 3b.

Spin on and pattern photoresist to define a gate top of length 250 nm, and use the patterned photoresist to etch gate material to form T-shaped gate; see FIG. 3c.

Continue as in foregoing to form interlevel dielectrics and interconnects.

5. Modifications

The preferred embodiments can be modified in various ways while retaining the feature of controlling gate texture to adjust gate work function.

For example, the NMOS and PMOS gates could be alloys for conducting compounds, such as TaN, which have work functions for differing textures which roughly approximate the n-Si and p-Si work functions.

What is claimed is:

1. An integrated circuit, comprising:
   (a) a substrate with NMOS and PMOS transistors;
   (b) wherein said NMOS transistors have gates made of a first gate material with a first texture directly adjacent nate dielectric; and
   (c) wherein said PMOS transistors have gates made of said first gate material with a second texture directly adjacent gate dielectric, said first texture and said second texture differing;
   (d) wherein: said gate material is tantalum.

2. An integrated circuit, comprising:
   (a) a substrate with NMOS and PMOS transistors;
   (b) wherein said NMOS transistors have gates made of a first gate material with a first texture directly adjacent gate dielectric; and
   (c) wherein said PMOS transistors have gates made of said first gate material with a second texture directly adjacent gate dielectric, said first texture and said second texture differing;
   (d) wherein: said gate material is molybdenum.

3. An integrated circuit, comprising:
   (a) a substrate with NMOS and PMOS transistors;
   (b) wherein said NMOS transistors have gates made of a first gate material with a first texture directly adjacent gate dielectric; and
   (c) wherein said PMOS transistors have gates made of said first gate material with a second texture directly adjacent gate dielectric, said first texture and said second texture differing;
   (d) wherein: said gate material is niobium.

* * * * *